(12) United States Patent
Ohtomo

(10) Patent No.: US 9,642,263 B2
(45) Date of Patent: May 2, 2017

(54) DISPLAY APPARATUS

(71) Applicant: CANON KABUSHIKI KAISHA, Tokyo (JP)

(72) Inventor: Ryo Ohtomo, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/066,661

(22) Filed: Mar. 10, 2016

(65) Prior Publication Data

US 2016/0270244 A1    Sep. 15, 2016

(30) Foreign Application Priority Data

Mar. 11, 2015   (JP) .................................. 2015-048591
Feb. 23, 2016   (JP) .................................. 2016-032090

(51) Int. Cl.
*H05K 7/20*       (2006.01)
*H05K 5/00*       (2006.01)

(52) U.S. Cl.
CPC ................... *H05K 5/0017* (2013.01)

(58) Field of Classification Search
CPC ...................................................... H05K 5/0017
See application file for complete search history.

(56) References Cited

FOREIGN PATENT DOCUMENTS

JP          09-105917 A       4/1997
JP          2009-103835 A     5/2009

*Primary Examiner* — Anthony Q Edwards
(74) *Attorney, Agent, or Firm* — Cowan, Liebowitz & Latman, P.C.

(57) ABSTRACT

Provided is a display apparatus including: a display panel; an exterior member made up of a plurality of separated bezels each disposed on a front surface side of a peripheral portion of the display panel; and at least one joint members disposed on inner sides of the bezels at at least one portion where the bezels are separated so as to connect the adjacent bezels, wherein each of the joint members has a first portion having elasticity and supporting a lower end of the display panel, and a second portion having higher rigidity than the first portion and making contact with the inner side of the bezel.

21 Claims, 12 Drawing Sheets

DISPLAY APPARATUS

BACKGROUND OF THE INVENTION

Field of the Invention

The present invention relates to a display apparatus.

Description of the Related Art

A display apparatus includes a display panel.

The display panel is a liquid crystal panel or an organic electroluminescence (EL) panel, for example, and has a configuration in which a display device such as a liquid crystal device or an organic luminescent device is provided between two glass substrates on which a thin film device is formed.

FIG. 1 is a front view illustrating an example of a conventional display apparatus. FIG. 2 is an exploded perspective view illustrating a configuration of the conventional display apparatus. FIG. 3 is a cross-sectional view along line A-A, illustrating an example of the conventional display apparatus. A display apparatus 1 including a display panel 10 has a configuration in which a metallic case 70 in which the display panel 10 is received or a base 71 to which the display panel 10 is attached is disposed on the opposite side from a display surface, and the display surface is covered by a metallic upper frame 25 and a front exterior 20. The display apparatus 1 in which the display panel 10 is a liquid crystal display panel includes a liquid crystal display panel, a backlight unit 80 that illuminates the liquid crystal display panel, and optical sheets 40 that condense light from the backlight unit 80. In general, the optical sheets 40 and the backlight unit 80 are disposed in that order on the back surface side of the liquid crystal display panel. A light source substrate 60, a light source 61, a reflective sheet 50, and the like are contained in the backlight unit 80. In general, with the aim to maintain a certain space from the optical sheets 40 and to hold the liquid crystal display panel itself, a resin-made panel holder 30 is disposed so as to cover the periphery and the back surface of the liquid crystal display panel. Moreover, the liquid crystal display panel is sandwiched by the panel holder 30 and a frame 25 disposed on the front surface, with a front elastic member 31 and a back elastic member 32 such as a cushion interposed.

The front exterior 20 generally has an angular structure and external impact 2 is likely to be applied to a lower corner. Thus, the front exterior 20 may be broken and the display panel 10 may be broken due to internal impact 3 caused by vibration and impact transmitted from the front exterior 20 to the display panel 10.

Japanese Patent Application Publication No. 2009-103835 discloses a structure in which a removable shock-absorbing member is provided in a corner of a front exterior to alleviate the impact. Moreover, Japanese Patent Application Publication No. H9-105917 discloses a structure in which an upper frame is provided on a display surface of a display panel, a lower frame is provided on a rear surface of the display panel to hold the display panel, a projection is provided on the lower frame as a positioning projection for the upper frame and the display panel, and a ring-shaped elastic member is disposed in the projection.

SUMMARY OF THE INVENTION

However, the conventional techniques described above have a problem that the techniques incur a limitation on the appearance of the shock-absorbing member and lack handling convenience. Moreover, since the conventional techniques disclose a structure in which a ring-shaped elastic member is disposed in the lower frame, there is a problem that the rigidity of the corner decreases, it is not easy to assemble the display panel, and it is difficult to reduce the thickness due to the presence of the lower frame.

Thus, the present invention provides a display apparatus capable of alleviating impact transmitted to a display panel when impact is applied to an exterior using a structural member of which the thickness can be easily reduced.

The present invention provides a display apparatus including: a display panel; an exterior member made up of a plurality of separated bezels each disposed on a front surface side of a peripheral portion of the display panel; and at least one joint member disposed on inner sides of the bezels at at least one portion where the bezels are separated so as to connect the adjacent bezels, wherein each of the joint members includes a first portion having elasticity and supporting a lower end of the display panel, and a second portion having higher rigidity than the first portion and making contact with the inner side of the bezel.

According to the present invention, it is possible to provide a display apparatus capable of alleviating impact transmitted to a display panel when impact is applied to an exterior using a structural member of which the thickness can be easily reduced.

Further features of the present invention will become apparent from the following description of exemplary embodiments with reference to the attached drawings.

DESCRIPTION OF THE EMBODIMENTS

Example 1

Hereinafter, Example 1 of the present invention will be described with reference to the drawings.

Figure 4:
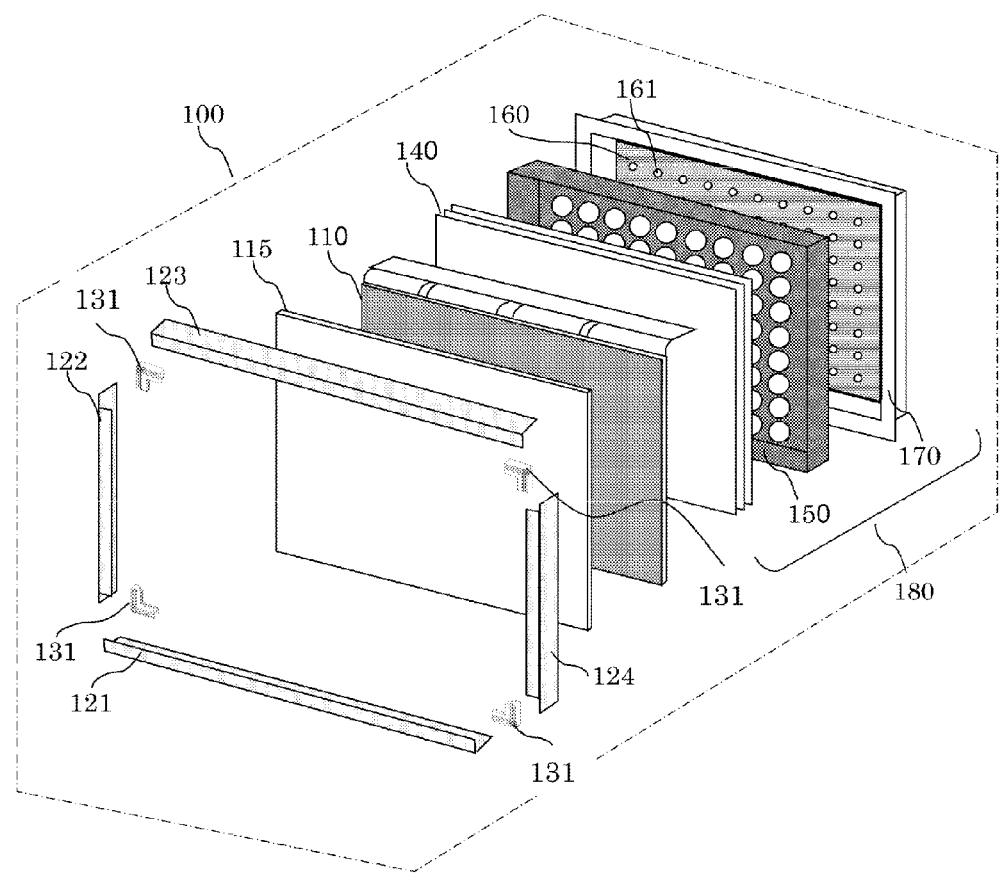
FIG. 4 is an exploded perspective view illustrating a configuration of a display apparatus according to Example 1.

FIG. 4 is an exploded perspective view illustrating a configuration of a display apparatus according to Example 1 of the present invention.

The configuration of Example 1 will be described with reference to FIG. 4. A display apparatus 100 includes a display panel 110 and a front plate 115 fixed to the surface of the display panel 110. The front plate 115 improves the rigidity of the surface of the display panel 110, and even when stress load occurs in a display surface of the display panel 110, the stress can be distributed. A phenomenon in which brightness uniformity or chromaticity uniformity on the screen decreases locally due to concentration of stress is referred to as display unevenness, and the display unevenness is suppressed in the configuration of Example 1 in which stress can be distributed. Although the front plate 115 is fixed to the display panel 110 by a front plate adhesive (not illustrated), the display panel 110 and the front plate 115 may be fixed using means other than the adhesive. The front plate 115 and the front plate adhesive are transparent materials having high transmissivity, and materials such as glass, acrylic resins, polycarbonate (PC) resins, and the like are preferred. Moreover, since the front plate 115 also serves as a rigid member, the thickness of the front plate 115 is preferably between 0.5 mm and 5 mm and the thickness of the front plate adhesive is preferably between 0.1 mm and 1 mm.

As an inner configuration, a case 170 is disposed on the rear surface of the display panel 110. In Example 1, the display panel 110 is a liquid crystal display panel. The display apparatus 100 includes a backlight unit 180 that illuminates the liquid crystal display panel 110 and an optical sheet 140 that condenses light from the backlight unit 180. The optical sheet 140 and the backlight unit 180 are disposed in that order on the back surface side of the liquid crystal display panel 110. A light source substrate 160, a light source 161, a reflective sheet 150, and the like are contained in the backlight unit 180. The reflective sheet 150 reflects light from the light source 161. The light source 161 such as a light emitting diode (LED) or a cold cathode fluorescent lamp (CCFL) is mounted on the light source substrate 160. Although a backlight type includes a direct type and an edge-light type, the configuration of the present invention is ideal for display apparatuses of any backlight type. Although the material of the case 170 may be a resin or metal, the case 170 is preferably formed of a metallic material when radiation and leveling of heat inside the backlight unit 180 is taken into consideration.

An exterior member (front exterior member) made up of a plurality of divided bezels is provided on a front surface side of each side of the peripheral portion of the display panel 110 and the front plate 115. The front exterior member is divided into four sides of a lower bezel 121, a left bezel 122, an upper bezel 123, and a right bezel 124. These bezels may be formed of metal or resin and are preferably formed of metal in order to improve rigidity. When the bezel is formed of metal, the material is preferably an alloy of aluminum, iron, magnesium, or the like. Although die cast forming or press forming can be used as a forming method, extrusion forming is also preferred, and in this case, the bezel can be formed using a low-cost mold. An average thickness during extrusion forming is preferably between 1 mm and 5 mm. Moreover, a back exterior (not illustrated) is coupled with the front exterior to form the exterior shape of the display apparatus 100.

Figure 1:
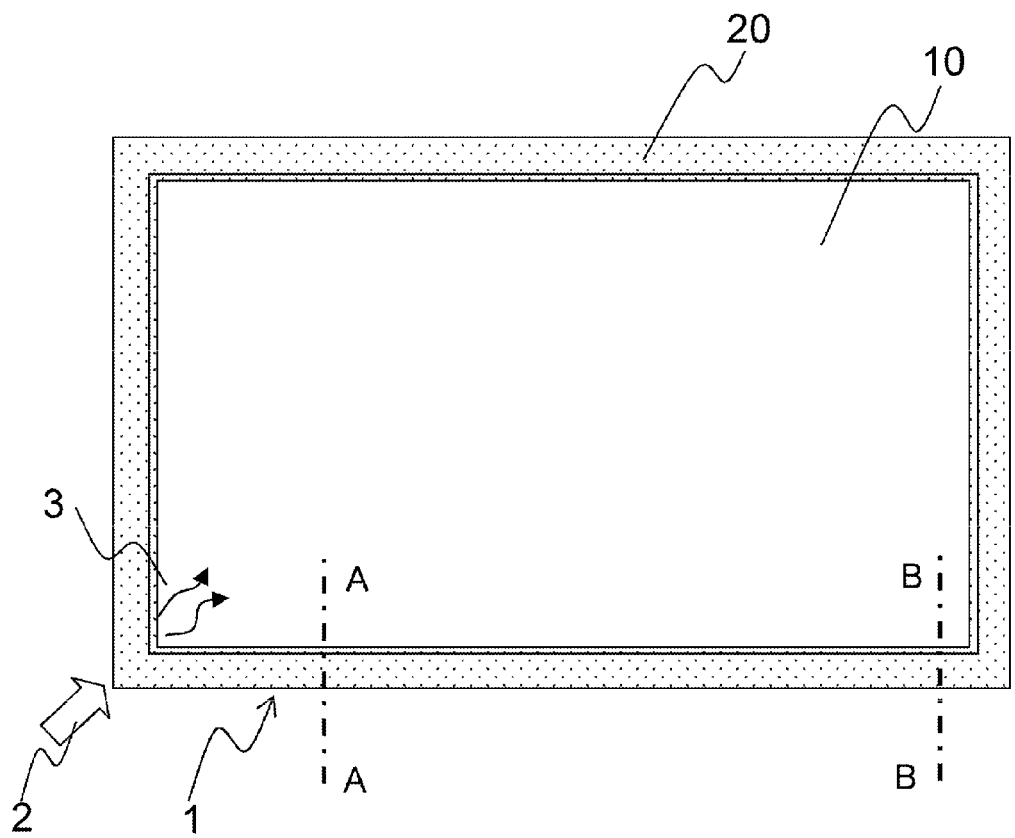
FIG. 1 is a front view illustrating an example of a conventional display apparatus.
Figure 2:
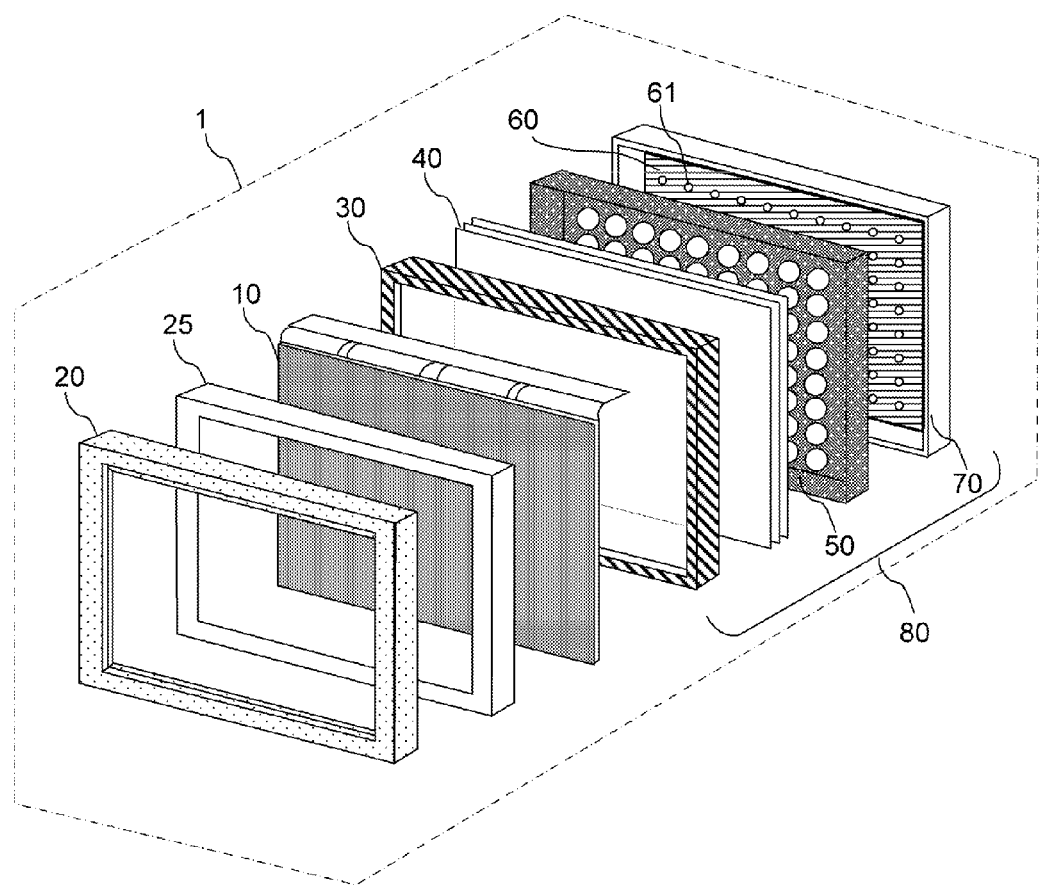
FIG. 2 is an exploded perspective view illustrating a configuration of the conventional display apparatus.
Figure 3:
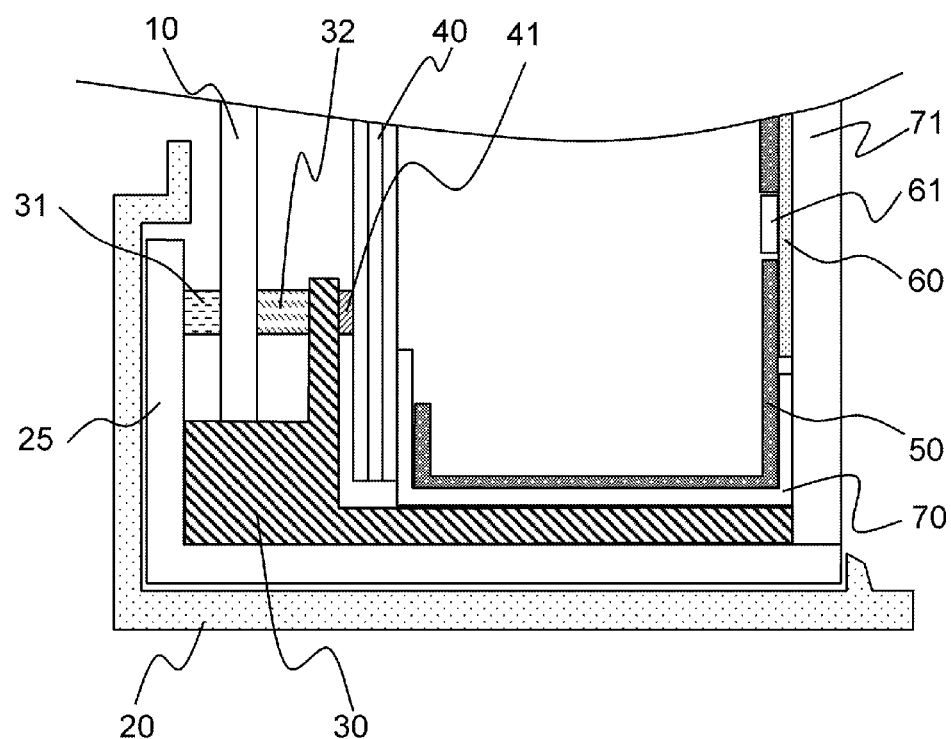
FIG. 3 is a cross-sectional view illustrating an example of the conventional display apparatus.
Figure 5:
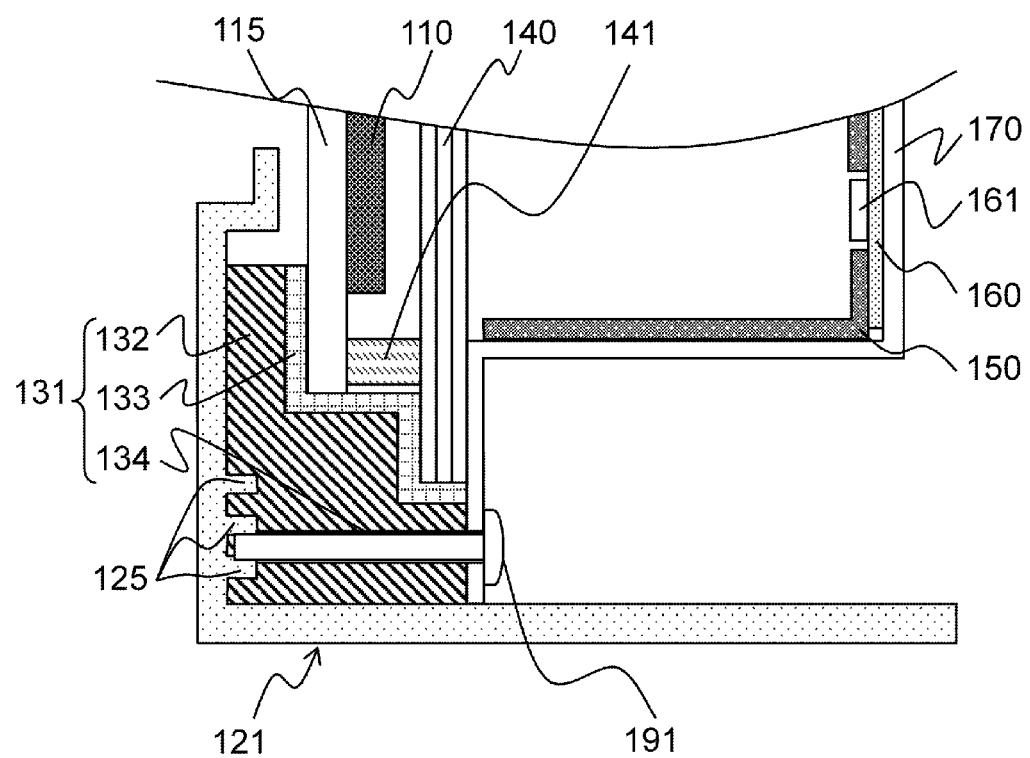
FIG. 5 is a cross-sectional view illustrating the display apparatus of Example 1.
Figure 6:
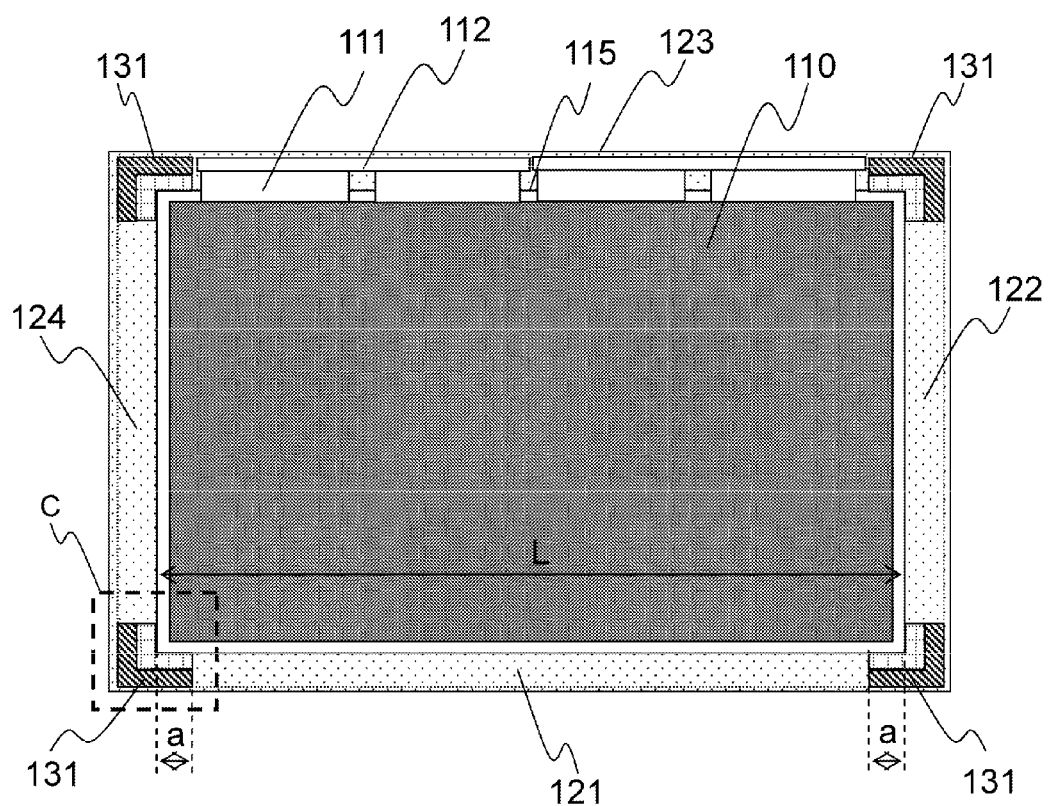
FIG. 6 is a back view illustrating a display panel holding structure of the display apparatus according to Example 1.
Figure 7:
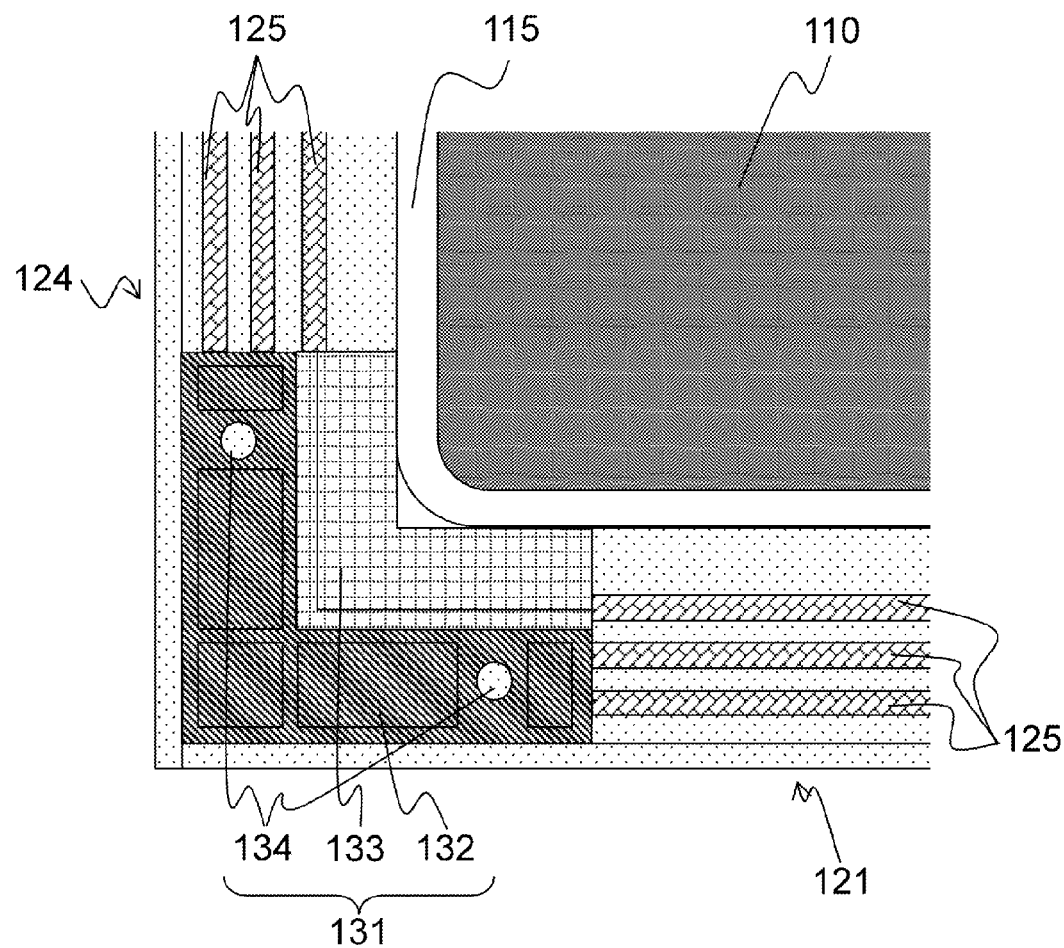
FIG. 7 is an enlarged view illustrating the display panel holding structure of the display apparatus according to Example 1.
Figure 8:
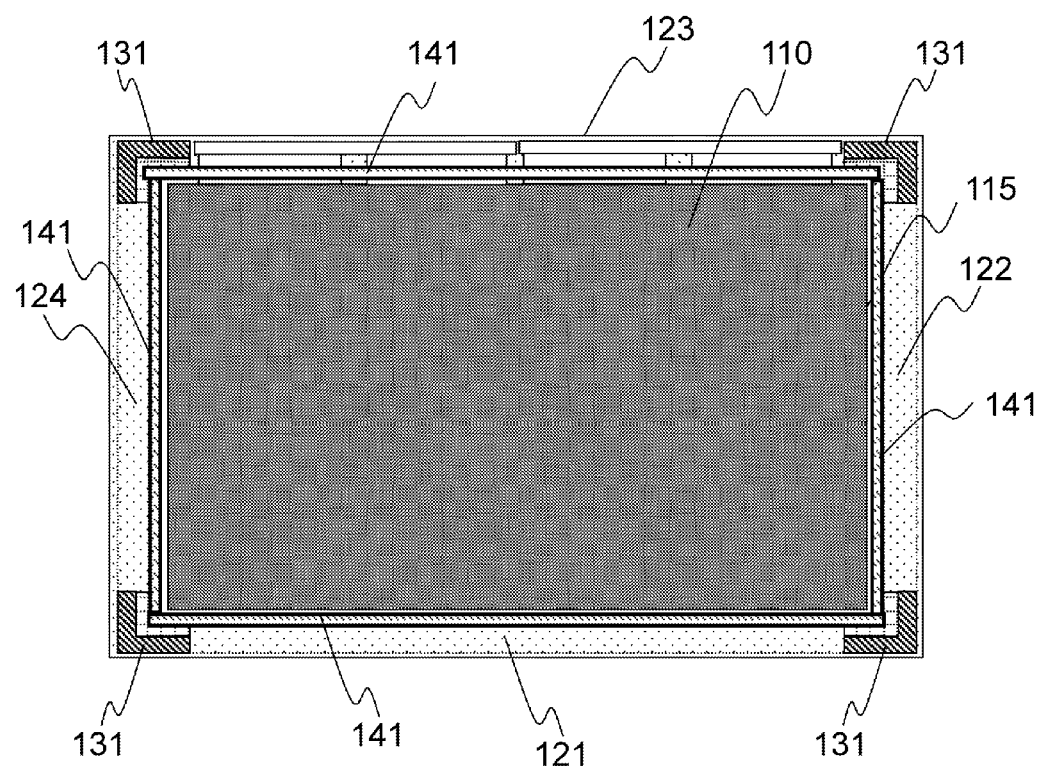
FIG. 8 is a back view illustrating a state in which back elastic members are disposed in the display panel holding structure of the display apparatus according to Example 1.

FIG. 5 is a cross-sectional view of the display apparatus 100 of FIG. 4, at the same position as the B-B cross-section in FIG. 1. FIG. 6 is a back view illustrating a display panel holding structure of the display apparatus 100 according to Example 1 of the present invention. FIG. 7 is an enlarged view of C-part in FIG. 6 and illustrates the display panel holding structure of the display apparatus 100. FIGS. 6 and 7 illustrate a state before an optical sheet is disposed. FIG. 8 is a back view illustrating a state in which back elastic members are disposed on the display panel holding structure of the display apparatus of Example 1.

Joints 131 are disposed at four corners as members that are disposed on the inner side of the front exterior member at the four corners of the display panel so as to connect (couple) the bezels on the four sides. The joints 131 will be described in more detail with reference to FIGS. 5, 6, and 7. As illustrated in FIGS. 5 and 6, the lower bezel 121 and the right bezel 124 are coupled by the joint 131. The joint 131 has a first portion and a second portion. The first portion is formed using elastic material having Young's modulus not more than 100 MPa. The second portion is formed using high-rigidity material having Young's modulus larger than 100 MPa. Material having Young's modulus from 1 Mpa to 10 MPa is preferable for the first portion, and material having Young's modulus not less than 1 GPa is preferable for the second portion. In the first embodiment, the joint 131 is divided into an elastic portion 133 as the first portion and a high-rigidity portion 132 as the second portion. Although the high-rigidity portion 132 and the elastic portion 133 may be formed of different members, the joint 131 may be formed by two-color forming. For example, although the high-rigidity portion 132 may be formed of PC, POM, or the like which are highly rigid materials, and the elastic portion 133 may be formed of elastomer which is an elastic material, the present invention is not limited thereto. Moreover, the elastic portion 133 is not limited to a forming material but can be formed of a sheet material such as cushion or rubber. One or a plurality of grooves (uneven shapes) like a concavity and convexity portion 125 is provided in a portion at which the bezels make contact with the high-rigidity portion 132 of the joint 131 so that the bezel and the high-rigidity portion 132 engage with each other to improve the coupling strength of the joint 131 and the bezels. Moreover, a fastening portion 134 is provided in the joint 131, and the bezels, the joint 131, the case 170 are fixed by a fastening member 191. A screw is an example of the fastening member 191 but the present invention is not limited thereto.

A holding structure of the joint 131, the front plate 115, and the optical sheet 140 will be described. The elastic portion 133 of the joint 131 makes contact with the lower side (the lower end) of the display surface of the front plate 115. Moreover, the elastic portion 133 of the joint 131 also makes contact with the lower side (the lower end) of the optical sheet 140. The elastic portion 133 is elastically deformed in response to external force to absorb the external force whereby the impact to the display panel and the optical sheet supported is alleviated. Moreover, a supporting length on the lower side where the front plate 115 makes contact with the joint 131 is preferably set as below. When an entire length of the front plate 115 is L and the supporting length on the lower side where the front plate 115 makes contact with the joint 131 is a, a relation of "$2a/L \geq 1/10$" is preferably satisfied. That is, when the supporting length is set to $1/10$ or more of the entire length, the weight is distributed and the impact can be distributed even when an external impact is applied.

Moreover, as illustrated in FIGS. 5 and 8, back elastic members 141 are disposed in a gap between the display surface of the optical sheet 140 and the side opposite to the display surface of the front plate 115 to maintain a constant space (distance) so that the compression force of the back elastic members 141 is used as holding force. Thus, a flexible material is preferably used for the back elastic members 141 and cushion, rubber, or the like is ideally used. The thickness of the back elastic members 141 is preferably between 2 mm and 10 mm and the compression force is generated when the thickness is set to be larger than the clearance between the front plate 115 and the optical sheet 140. Moreover, the back elastic members 141 are disposed on four sides of the display panel 110 so as to cross or abut each other near the joints 131 in order to prevent entrance of dust into the backlight unit. In this way, it is possible to prevent entrance of dust between the optical sheet 140 and the display panel 110. The case 170 makes contact with the side opposite to the display surface of the optical sheet 140. In this case, since the case 170 is sometimes formed of metal, a shock-absorbing sheet may be disposed between the optical sheet 140 and the case 170 to prevent scratches on the optical sheet 140. Although the structure of the lower bezel 121 and the joint 131 has been described, a supporting structure of the display apparatus 100 may be configured to change the screen orientation by rotation. In such a configuration, any bezel may be the lower side. The same structure as the structure between the lower bezel 121 and the joint 131 may be employed between the other bezels 122, 123, and 124 and the joint 131. Moreover, a flexible wire 111 and a drain substrate 112 are disposed on the upper side of the display panel 110 so as to drive the display panel 110, and the joints 131 are disposed at four corners. Thus, it is necessary to realize a shape and an arrangement which does not interfere with the flexible wire 111 and the drain substrate 112. The same is true for when the flexible wire 111 and the drain substrate 112 are disposed on the lower side of the display panel 110. When these joints 131 are used as the holding members for the front plate 115 and the optical sheet 140, it is possible to simplify the structure by eliminating a panel holder which was conventionally used for holding the panel and the optical sheet.

More specific examples will be described.

First, glass was used as the material of the front plate 115 and the thickness thereof was set to 1.5 mm. A silicone-based adhesive was used as the front plate adhesive for attachment to the display panel 110 and the average thickness thereof was set to 0.3 mm. Moreover, an exterior member made up of divided members of the four sides of the lower bezel 121, the left bezel 122, the upper bezel 123, and the right bezel 124 was provided on the front surface side of the peripheral portion of the display panel 110 and the front plate 115. The bezels on the four sides were formed by extrusion forming using an aluminum compound A6063S. The ends of the bezels were formed by mechanical machining in order to couple adjacent bezels. The bezels were manufactured so that the average thickness thereof was 2.5 mm, and the grooves of the concavity and convexity portion 125 to be engaged with the joints 131 were formed at three positions. The groove width was 2 mm and the groove height was 5 mm. The high-rigidity portion 132 and the elastic portion 133 of the joint 131 were manufactured using a resin by two-color forming. PC was used as the material of the high-rigidity portion 132 and a flexible elastomer was used as the material of the elastic portion 133. The average thickness of the elastic portion 133 was set to 2 mm. A groove was formed in the high-rigidity portion 132 so as to be engaged with the bezel. Moreover, a screw thread was formed in a portion of the groove and the fastening portion 134 of the joint 131 and the case 170 were fixed by the fastening member 191 serving as a screw. M3 screws were employed. Moreover, the front plate 115 and the optical sheet 140 were configured to be held in contact with the elastic portion 133, and a silicone-based cushion were used as the back elastic members 141 positioned on the back surface side of the front plate 115. The clearance between the front plate 115 and the optical sheet 140 was set to 3.5 mm and the thickness of the back elastic members 141 was set to 4 mm so that compression force of 0.5 mm was generated and used as holding force.

In the display apparatus 100 of Example 1, the front exterior member is formed of bezels divided into four sides, the bezels are coupled by joint members at four corners, and the joint members are formed of the high-rigidity portion and the elastic portion to hold the panel and the optical sheet. Since the joints have such a structure that couples the bezels and holds the panel and the optical sheet, even when an impact (external force) is applied to the exterior member, the impact on the panel is alleviated. Moreover, it is possible to simplify the structure and to reduce the thickness.

Example 2

Next, Example 2 of the present invention will be described with reference to the drawings. In Example 2, the structure of four corners different from that of Example 1 will be described.

Figure 9:
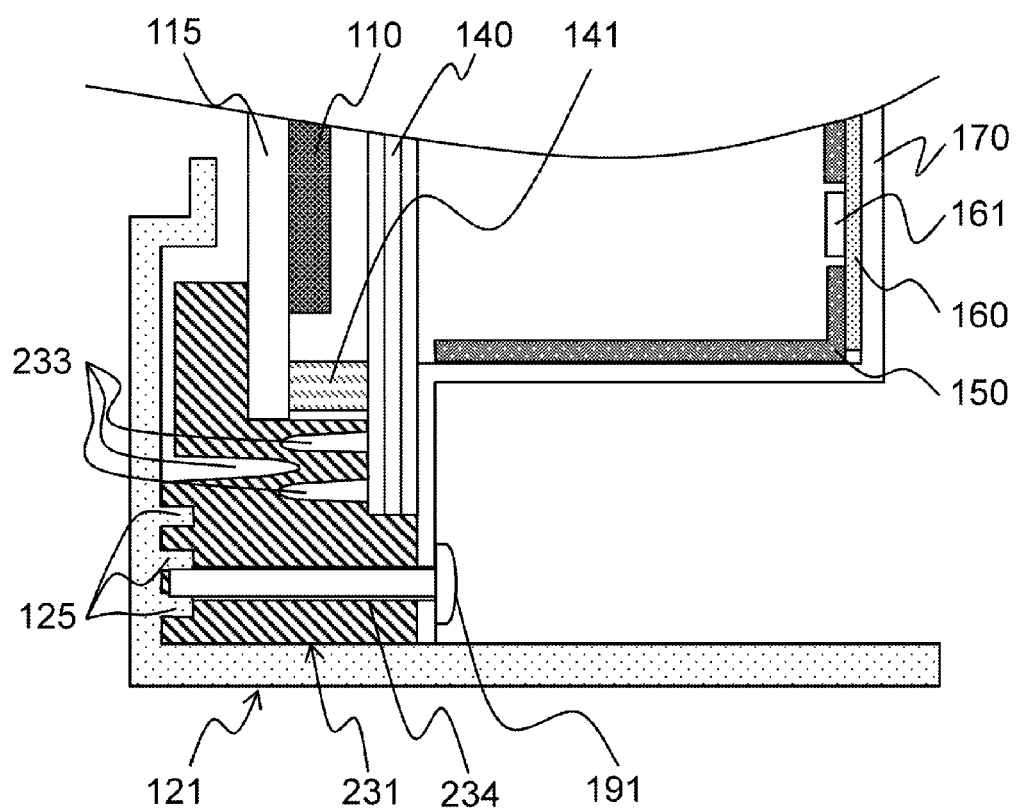
FIG. 9 is a cross-sectional view illustrating a display apparatus according to Example 2.

FIG. 9 is a cross-sectional view illustrating a display apparatus according to Example 2 of the present invention, at the same position as the B-B cross-section in FIG. 1.

Example 2 is substantially the same as Example 1, but as illustrated in FIG. 9, an elastic shape 233 and a fastening portion 234 that fastens members are formed in a joint 231. The joint 231 is preferably formed by forming resins using a highly rigid material, and a material such as PC, POM, or PC+ABS is ideally used. The elastic shape 233 is preferably provided at a position on the lower surface in relation to holding the front plate 115. Although the elastic shape is not particularly limited, such a shape that, when an impact is applied to the exterior, the joint 231 is elastically deformed at a segment of the elastic shape 233 to absorb the impact is useful. For example, as illustrated in FIG. 8, at least one or more groove shapes are formed, and a clearance is secured between the back surface side (the surface facing the front plate 115) of the lower bezel 121 and the display surface side of the joint 231 to form an elastic shape.

Although the holding structure of the front plate 115 and the optical sheet 140 is the same as that of Example 1, a contacting surface is preferably formed of a sheet material like PET having sliding properties since the holding structure makes contact with the joint 231 formed of a rigid material.

With the configuration of Example 2, it is possible to form the joint member using one kind of material and to simplify the manufacturing of the joint member as compared to Example 1. According to Example 2, it is easy to reduce the thickness of the display apparatus with a simple structure and an advantage of alleviating an impact on the display panel when the impact is applied to the exterior is obtained similarly to Example 1.

Example 3

Next, Example 3 of the present invention will be described with reference to the drawings. In Example 3, the structure of four corners different from that of Example 1 will be described in detail.

Figure 10:
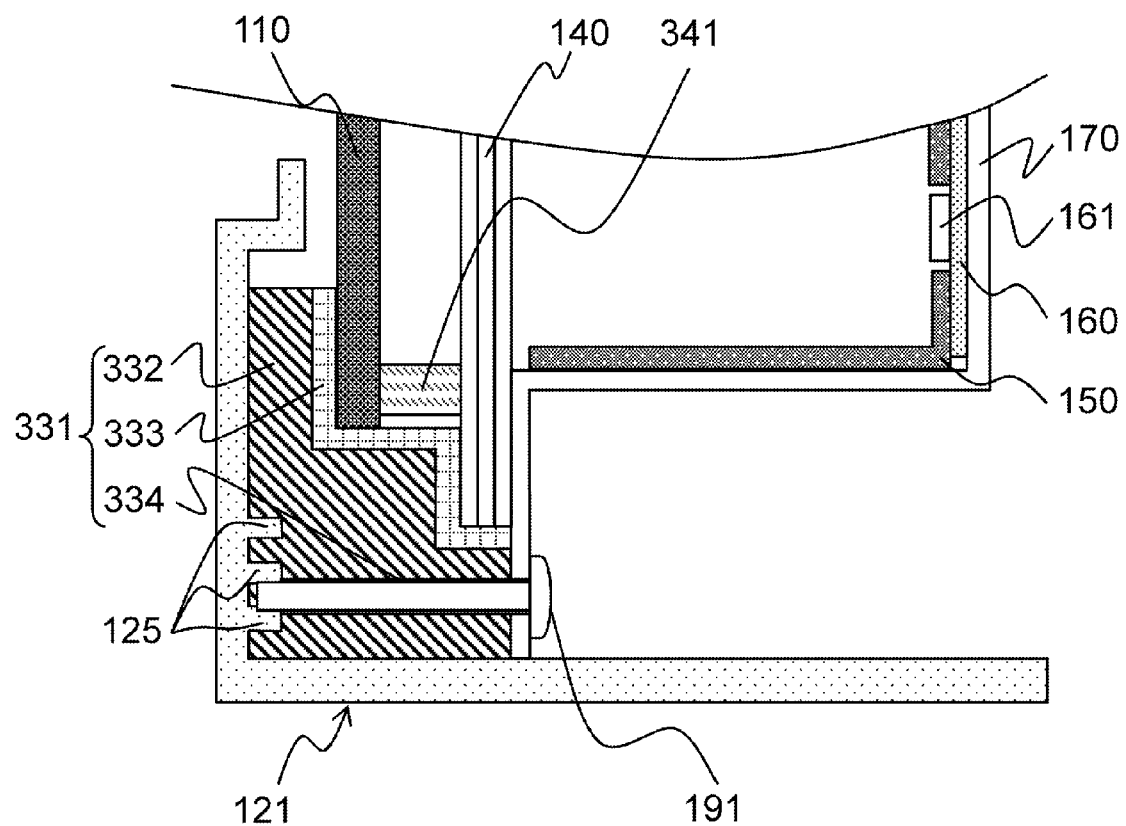
FIG. 10 is a cross-sectional view illustrating a display apparatus according to Example 3.

FIG. 10 is a cross-sectional view illustrating a display apparatus according to Example 3 of the present invention, at the same position as the B-B cross-section of FIG. 1.

A structure illustrated in FIG. 10 is substantially the same as that of Example 1, but the front plate is not provided in the structure and the display panel 110 and the joint 331 are held by bringing the display panel 110 into direct contact with a joint 331. The shape, the configuration, and the material of the joint 331 are the same as those of Example 1, and a high-rigidity portion 332, an elastic portion 333, and a fastening portion 334 are formed. Moreover, back elastic members 341 are disposed in a gap between the side opposite to the display surface of the display panel 110 and the display surface of the optical sheet 140 to maintain a constant space so that the compression force of the back elastic members 341 is used as holding force. The material and the shape of the back elastic members 341 are the same as those of Example 1.

With the configuration of Example 3, in a display apparatus in which the front plate is not present on the surface of the display panel 110, it is easy to reduce the thickness of the display apparatus with a simple structure and an advantage of alleviating an impact on the display panel when the impact is applied to the exterior is obtained.

Example 4

Next, Example 4 of the present invention will be described with reference to the drawings. In Example 4, the structure of four corners different from that of Example 1 will be described in detail.

Figure 11:
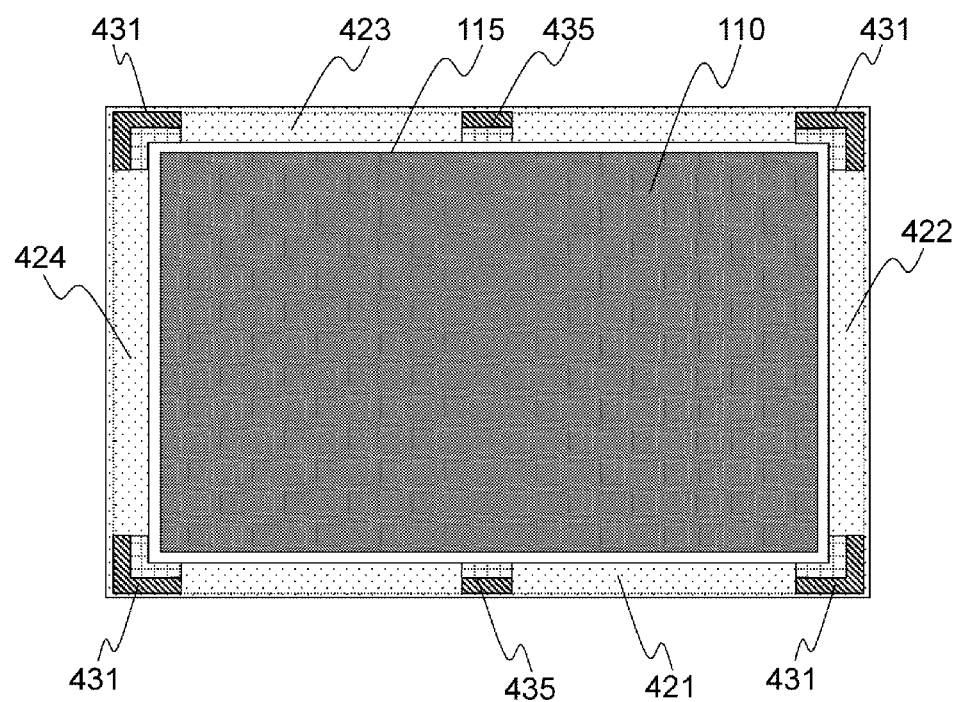
FIG. 11 is a back view illustrating a display panel holding structure of a display apparatus according to Example 4.

FIG. 11 is a back view illustrating a display panel holding structure of a display apparatus according to Example 4 of the present invention. FIG. 11 illustrates a state before an optical sheet is disposed.

Example 4 is substantially the same as Example 1, and is useful when a display apparatus and a display panel have a large size. As illustrated in FIG. 11, the front exterior of the display apparatus is formed of a lower bezel 421, a left bezel 422, an upper bezel 423, and a right bezel 424, and the four corners are coupled by the joints 431. The manufacturing method, the material, and the configuration of the joint 431 and the bezels are the same as those of Example 1. At least one or more holding members 435 are disposed between the joints 431 of the lower and upper bezels 421 and 423 which are long-side bezels. The holding member 435 can prevent bending of the display panel 110, the front plate 115, and the optical sheet 140. The holding member 435 can be formed using the same manufacturing method, the same material, and the same shape as the joint 431. Although the holding member 435 has a bending preventing function and is disposed on the long-side bezel, the holding member 435 may be disposed between the joints 431 of the left and right bezels 422 and 424 which are short-side bezels. Moreover, although the holding member 435 can effectively prevent bending by being disposed at the center of the bezel, the present invention is not limited thereto.

With the configuration of Example 4, by disposing the joint and the holding member, it is easy to reduce the thickness of a in a large display apparatus with a simple structure and an advantage of alleviating an impact on the display panel when the impact is applied to the exterior is obtained.

Example 5

Next, Example 5 of the present invention will be described with reference to the drawings. In Example 5, the structure of four corners different from that of Example 1 will be described in detail.

Figure 12:
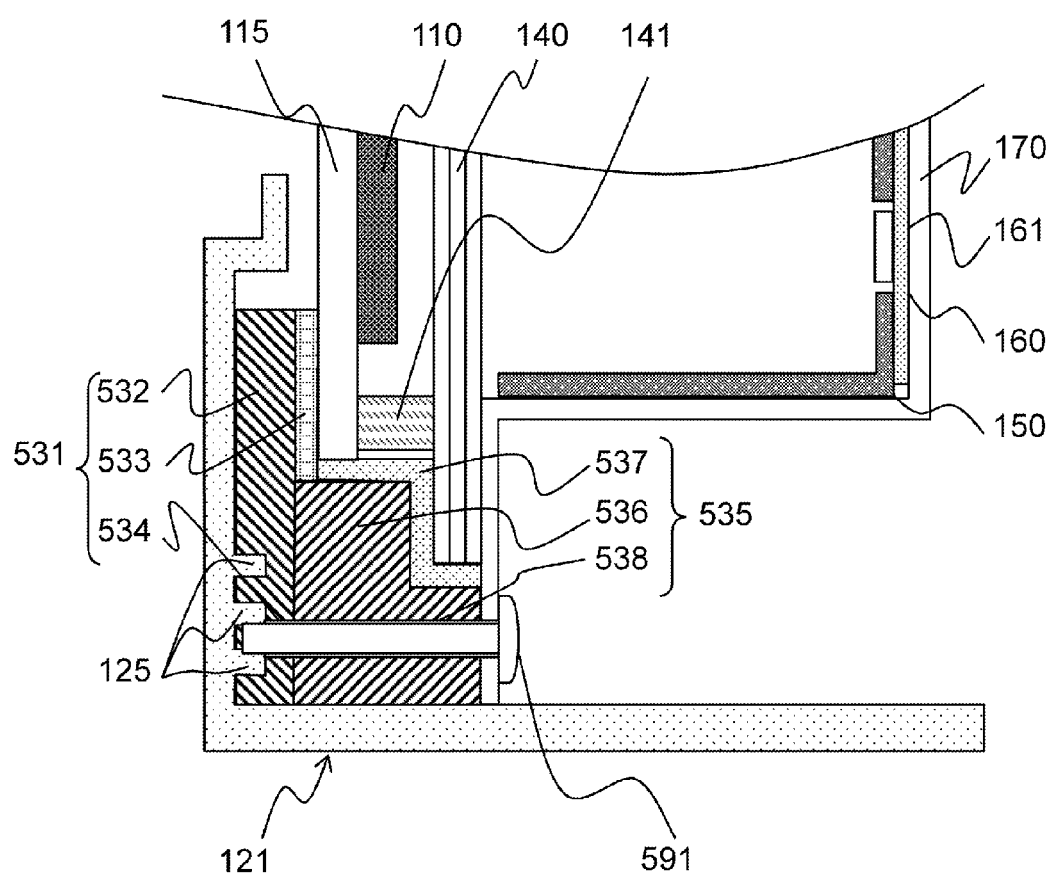
FIG. 12 is a cross-sectional view illustrating a display apparatus according to Example 5.

FIG. 12 is a cross-sectional view illustrating a display apparatus according to Example 5 of the present invention.

Example 5 is substantially the same as Example 1, but as illustrated in FIG. 12, the joint is made up of two separate members of a joint holding portion 531 and a joint supporting portion 535. With such a joint configuration, the force acting on the front plate 115 from the front surface side (the joint holding portion 531) and the force acting on the front plate 115 from the lower end side (the joint supporting portion 535) can be set individually. Moreover, a joint having a complex shape can be formed using a combination of a plurality of members having a simple shape. The joint holding portion 531 includes a high-rigidity portion 532 making contact with the bezel 121, an elastic portion 533 making contact with the front plate 115, and a fastening portion 534. Moreover, the joint supporting portion 535 includes a high-rigidity portion 536 making contact with the bezel 121, an elastic portion 537 making contact with the front plate 115, and a fastening portion 538. Here, the fastening portion 534 of the joint holding portion 531 and the fastening portion 538 of the joint supporting portion 535 are fixed to the bezel 121 by a fastening member 591. The joint holding portion 531 and the joint supporting portion 535 are each formed of a rigid member and an elastic member.

By making the material and the rigidity of the high-rigidity portion 532 of the joint holding portion 531 different from those of the high-rigidity portion 536 of the joint supporting portion 535, the quality and the elasticity of the elastic portion 533 of the joint holding portion 531 can be made different from those of the elastic portion 537 of the joint supporting portion 535. For example, the material and the rigidity can be set according to the size, the weight, and the amount of warp of the front plate 115 and the display panel 110. By doing so, the force applied to the front plate 115 can be set more appropriately, and the impact on the panel can be alleviated more ideally. Moreover, it is possible to simplify the structure.

According to the present invention, it is possible to alleviate an impact on the display panel even when the impact is applied to the exterior and to simplify an inner structural member and to reduce the thickness. In the above described embodiments, although the characteristic effects of the present invention is explained on the basis of some exemplary configurations of a display having the joints provided at four corners of the display are explained, the effect of the invention can be achieved by a display having at least one joint is provided at at least one corner of the display. For example, although the displays described in the above described embodiments have a bezel separated into four parts, the number of separated parts is not limited to four. A display having a bezel divided into two parts, one provided at the right-upper corner and another provided at the left-lower corner, is included in the scope of the present invention, for example. Embodiments of the invention are not limited to the display configured to have the joints which connects the bezels at the four corners of the display. In the display configured to have a bezel divided into two parts, one provided at the right-upper corner and another provided at the left-lower corner, the joints would be provided at the two corners. Although the above described embodiments are examples where the present invention is applied to displays having a shape with four sides, that is, a square or rectangle shape or an approximately square or rectangle shape, shapes of displays to which the invention can be applied are not limited to such shapes. For example, a display having a round-shaped display panel to which the invention is applied comprises an exterior member made up of a plurality of separated bezels each disposed on a front surface of a peripheral portion (a perimeter of a round-shape or a circle) of the display panel, and a plurality of joints members disposed on inner sides of the bezels at the separated portions so as to connect the adjacent bezels. For example, if the display has a bezel separated into three parts and each of the separated bezels has a length of one third of the circle's perimeter, there are three portions where bezels are separated from each other, and at least one joint member is disposed on inner sides of the bezels at at least one portions where the bezels are separated so as to connect the adjacent bezels. According to such a configuration, the above described characteristic effects of the invention is available in a display having non-rectangle-shaped display panel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-048591, filed on Mar. 11, 2015, and Japanese Patent Application No. 2016-032090, filed on Feb. 23, 2016, which are hereby incorporated by reference herein in their entirety.

What is claimed is:

1. A display apparatus comprising:
a display panel;
an exterior member made up of a plurality of separated bezels each disposed on a front surface side of a peripheral portion of the display panel; and
at least one joint member disposed on inner sides of the bezels at at least one portion where the bezels are separated so as to connect the adjacent bezels, wherein
each of the joint members has a first portion having elasticity and supporting a lower end of the display panel, and a second portion having higher rigidity than the first portion and making contact with the inner side of the bezel.

2. The display apparatus according to claim 1, wherein the display panel has an approximately rectangle shape, the bezel is disposed on the front surface side of each side of the peripheral portion of the display panel; and
the joint member is at least one member disposed on the inner sides of the bezels at at least one corner of the display panel so as to connect the adjacent bezels.

3. The display apparatus according to claim 2, wherein the joint members are a plurality of members disposed on the inner sides of the bezels at four corners of the display panel so as to connect the adjacent bezels.

4. The display apparatus according to claim 1, wherein the second portion of the joint member is formed using a material having higher rigidity than the first portion, and the first portion is formed using a material having elasticity.

5. The display apparatus according to claim 1, wherein the second portion and the first portion of the joint member are formed using the same material, and the first portion has such a structure having a plurality of grooves that is elastically deformed in response to external force.

6. The display apparatus according to claim 5, wherein a gap is formed between the first portion of the joint member and an inner surface of the bezel.

7. The display apparatus according to claim 1, wherein the second portion of the joint member makes contact with the inner side of the bezel, and a plurality of concavities and convexities that engage with each other are formed in the contacting portion in the second portion of the joint member and the contacting portion in the inner side of the bezel.

8. The display apparatus according to claim 1, wherein the bezel is formed by extrusion forming using a metallic material.

9. The display apparatus according to claim 1, wherein the first portion of the joint member also makes contact with a front surface side of the display panel.

10. The display apparatus according to claim 1, wherein the first portion of the joint member has a holding portion that makes contact with a front surface side of the display panel, and a supporting portion that makes contact with the lower end of the display panel, and the holding portion and the supporting portion are separate members, and
the holding portion and the supporting portion are each formed of a rigid member and an elastic member.

11. The display apparatus according to claim 1, further comprising:
a transparent front plate fixed to a surface of the display panel, wherein
the first portion of the joint member supports a lower end of the front plate.

12. The display apparatus according to claim 1, further comprising:
an optical sheet disposed on a back surface side of the display panel, wherein
the first portion of the joint member supports a lower end of the optical sheet.

13. The display apparatus according to claim 12, further comprising:
elastic members disposed between a front surface side of the optical sheet and the back surface side of the display panel so as to maintain a distance between the optical sheet and the display panel and to exert force that holds the display panel in relation to the optical sheet.

14. The display apparatus according to claim 13, wherein the display panel has an approximately rectangle shape, and
the elastic members that hold the optical sheet are disposed along at least one side of the display panel in a manner of crossing or touching each other at at least one corner where the joint members are provided.

15. The display apparatus according to claim 1, wherein the display panel has an approximately rectangle shape, further comprising:
a holding member disposed on the inner side of the bezel at at least one position of each side of the peripheral portion of the display panel, the holding member having an first portion that supports the lower end of the display panel, and a second portion that makes contact with the inner side of the bezel.

16. The display apparatus according to claim 15, wherein the second portion of the holding member is formed using a material having higher rigidity than the first portion, and the first portion is formed using a material having elasticity.

17. The display apparatus according to claim 15, wherein the second portion and the first portion of the holding member are formed using the same material, and the first portion has such a structure having a plurality of grooves that is elastically deformed in response to external force.

18. The display apparatus according to claim 1, wherein the first portion is formed using a material having Young's modulus not more than 100 MPa.

19. The display apparatus according to claim 1, wherein the first portion is formed using a material having Young's modulus from 1 Mpa to 10 MPa.

20. The display apparatus according to claim 1, wherein the second portion is formed using a material having Young's modulus larger than 100 MPa.

21. The display apparatus according to claim 1, wherein the second portion is formed using a material having Young's modulus not less than 1 GPa.

* * * * *